United States Patent [19]

Lao et al.

[11] Patent Number: 6,107,187

[45] Date of Patent: Aug. 22, 2000

[54] METHOD FOR FORMING A SEMICONDUCTOR DEVICE

[75] Inventors: Keith Q. Lao; Yuri Y. Karzhavin, both of Glen Allen; Patrick Michael Kelly, Midlothian, all of Va.

[73] Assignee: Motorola, Inc., Schaumburg, Ill.

[21] Appl. No.: 09/334,906

[22] Filed: Jun. 17, 1999

[51] Int. Cl.[7] .................................................. H01L 21/76
[52] U.S. Cl. ......................... 438/633; 438/620; 438/621
[58] Field of Search ................................... 438/620, 631, 438/633

[56] References Cited

U.S. PATENT DOCUMENTS 5,173,439   12/1992   Dash et al. ................................ 437/67
5,719,073   2/1998    Shaw et al. ............................. 437/228

FOREIGN PATENT DOCUMENTS 0 545 263 A2   6/1993   European Pat. Off. ........ H01L 21/76

OTHER PUBLICATIONS

B. Davari et al., A New Planarization Technique, Using a Combination of Rie and Chemical Mechanical Polish (CMP), 1989 IEEE, pp. 3.41–3.44.

S.S. Cooperman et al., "Optimization of a Shallow Trench Isolation Process for Improved Planarization", J. Electrochem. Soc., vol. 142, No. 9, Sep. 1995, pp. 3181–3185.

*Primary Examiner*—Charles Bowers
*Assistant Examiner*—Lisa Kilday
*Attorney, Agent, or Firm*—Robert A. Rodriguez

[57] ABSTRACT

An opening (24) is formed in a substrate (20). A first layer (30) is formed over the substrate (20) and the feature opening (24). A second layer (40) is formed over the first layer (30) and then the second layer is removed until exposing portions (50) of the first layer (30). The exposed portions (50) of the first layer (30) are then optionally removed using remaining portions (52) of the second layer (40) as a patterning mask to form a cavity (60) in the first layer (30). The remaining portions of the second layer (52) are then removed and the first layer (30) is polished to form a semiconductor device structure (80). In one embodiment, the first layer is dielectric layer, and in an alternative embodiment, the first layer is a conductive layer.

20 Claims, 4 Drawing Sheets

METHOD FOR FORMING A SEMICONDUCTOR DEVICE

FIELD OF THE INVENTION

The present invention relates generally to a process for forming a semiconductor device, and more particularly, to a process for planarizing surfaces of a semiconductor device substrate.

BACKGROUND OF THE INVENTION

The scaling of semiconductor devices into the sub 0.5 micron (um) geometry regime is forcing many semiconductor device manufacturers to incorporate alternative processing technologies into the fabrication of semiconductor devices. Refilled trench structures are an example of such a processing technology. The advent of trench-fill technology is gaining wider acceptance as improvements continue in the area of chemical mechanical planarization (CMP) processing. Trench technology is being used in several VLSI and ULSI applications. Among them include the replacement of currently used isolation technologies, such as local oxidation of silicon (LOCOS), the formation of trench interconnect structures, and the formation of trench capacitor structures.

Typically, a trench-filled structure is formed by first forming a trench opening within a semiconductor device substrate. A dielectric or conductive fill material is then deposited to fill the trench opening, and a CMP process removes excess portions of the fill material, thereby forming the trench-filled structure. Depending on the fill material composition and the CMP process used, the time to remove the fill material can be considerable. This situation is further complicated as the depth of the trench opening and the thickness of trench-fill material are increased to accommodate a variety of processing and design considerations. In addition, non-uniformity of the substrate surface after depositing the fill material can impact the final planarity of the surface of the substrate. This is because polishing processes are generally limited in their ability to substantially planarize highly undulated surfaces.

One prior art method of reducing the substrate surface's non-uniformity includes first lithographically patterning the substrate and then using an etch process to remove an entire thickness of the trench-fill material at selected locations before polishing the trench-fill material to form the trench isolation feature. The exposed areas of the patterned surface generally correspond to regions of the substrate surface having thicker amounts of fill material. This method can effectively remove portions of the fill material, however, exposing and developing the substrate requires the additional lithographic processing steps. This additional processing is undesirable because it is time consuming, expensive, and further complicates the manufacturing process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with one embodiment of the present invention, an opening is formed in a substrate. A first layer (fill material) is formed over the semiconductor device substrate to fill the opening. A second layer (blanket layer) is then formed over the first layer and portions of the second layer are removed until exposing portions of the first layer. Portions of the first layer are then optionally selectively etched relative to the second layer. Remaining portions of the second layer are then removed and the remaining portions of the first layer are polished. In one embodiment, the first layer is an insulating material, and in an alternative embodiment, the first layer is a conductive material.

Figure 1:
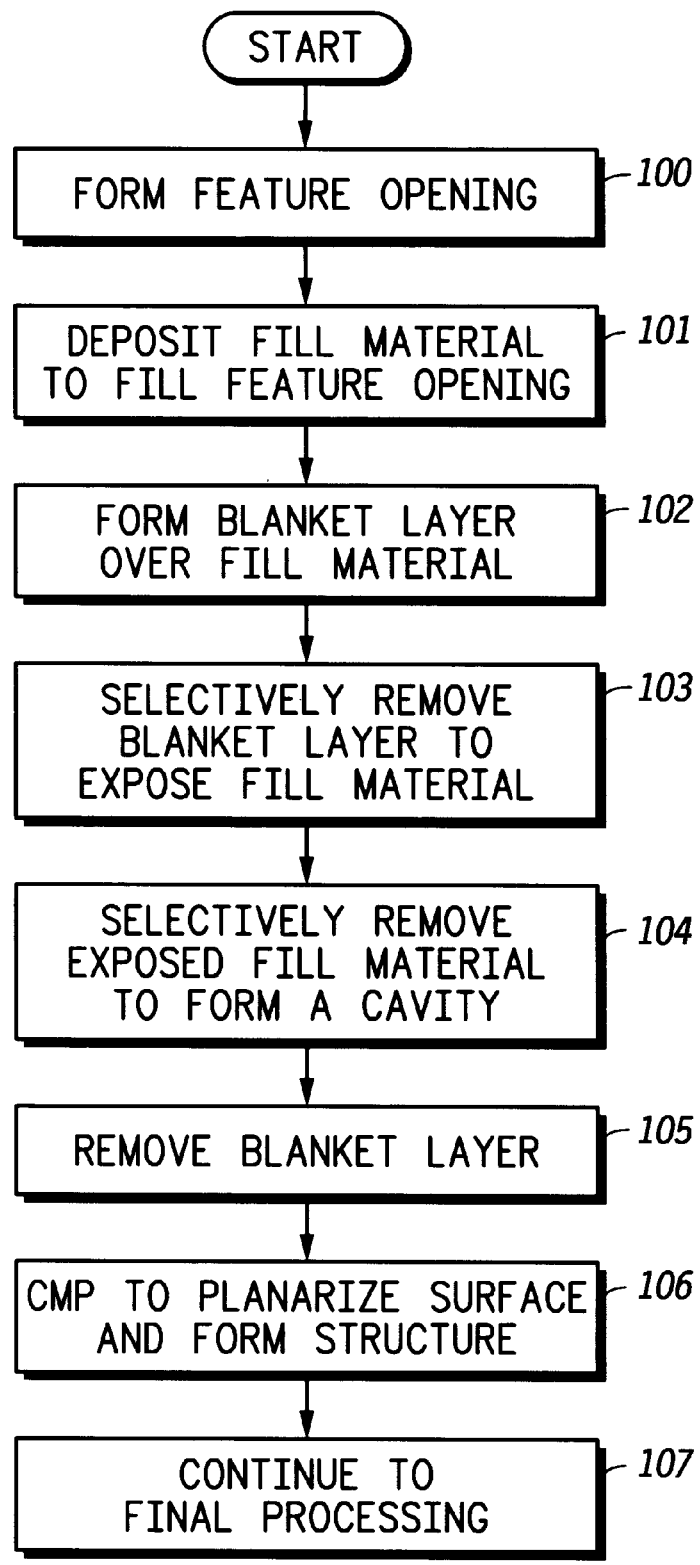
FIGS. 1–9 include illustrations of cross-sectional views of a portion of a semiconductor device substrate during formation of a semiconductor device in accordance with one embodiment of the present invention.

An embodiment of the present invention will now be described more fully with references to the accompanying figures. FIG. 1 includes a block diagram illustrating a process flow of one embodiment of the present invention. In block 100, a feature opening is formed. In block 101, a fill material is deposited to fill the feature opening. In embodiments described herein, the fill material can be either an insulating-type material or a conductive-type material. In block 102, a blanket layer is formed over the fill material using a material, such as resist or any other material capable of being selectively etched with respect to the fill material. In block 103, the blanket layer is selectively removed, using an ash or etch process, until portions of the fill material are exposed. In block 104, portions of the exposed fill material are selectively removed, relative to the remaining blanket layer, to form a cavity. In block 105, remaining portions of the blanket layer are removed, and in block 106, remaining portions of the fill material are polished to form the semiconductor device structure. In block 107, the semiconductor device structure continues on to final processing.

Figure 2:
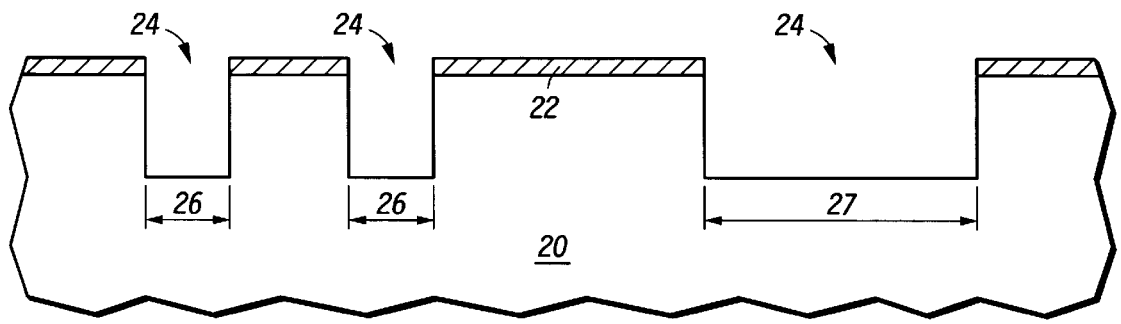

FIG. 2 includes an illustration of a cross-sectional view of a portion of a semiconductor device. The semiconductor device comprises a semiconductor substrate 20, a polish stop layer 22, and trench openings 24. The trench openings 24 are formed within the polish stop layer 22 and the semiconductor substrate 20. In one embodiment, the semiconductor substrate 20 is a monocrystalline silicon substrate. Alternatively, the semiconductor substrate 20 may be a semiconductor-on-insulator substrate, or any other substrate used in forming semiconductor devices. The polish stop layer 22 is formed over the substrate 20 and is typically formed as a silicon nitride material deposited using a conventional low-pressure chemical vapor deposition (LPCVD) process. The thickness of the polish stop layer 22 is typically in a range of approximately 50–200 nanometers (nm). Alternatively, the polish stop layer 22 can be formed using other deposition techniques and with other materials including polysilicon, amorphous silicon, oxides, or any other material capable of being selectively polished with respect to a subsequently deposited trench-fill material.

For the purpose of demonstration, two trench dimensions 26 and 27 are illustrated in FIG. 2. The dimension 26 is typically in a range of approximately 0.25–0.5 microns and the dimension 27 is typically in a range of approximately 0.5–1.0 microns. However the dimension 27 can and often does exceed 100 microns. Typically, the trench openings 24 are etched into the substrate 20 to a depth in a range of approximately 200–300 nm. The etch process used to form the trench is conventional.

Figure 3:
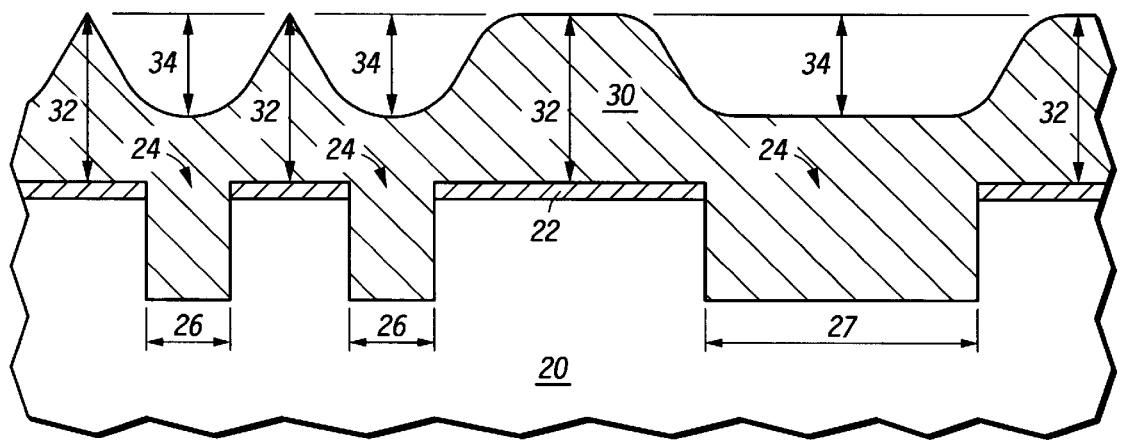

A conformally deposited trench-fill material 30 is deposited over the substrate 20 and within the trench openings 24 as shown in FIG. 3. A conformal film is not a requirement of the present invention, however, it facilitates the filling of the trench openings with minimal voiding. In one embodiment, the trench-fill material 30 is a layer of silicon oxide deposited using a high-density plasma CVD (HDP-CVD) process. Alternatively, the trench-fill material 30 may be formed using tetraethylorthosilicate (TEOS), fluorinated TEOS, borophosposilicate glass (BPSG), phosphosilicate glass (PSG), borophospho-TEOS (BP0-TEOS), a spin on glass, a low-k dielectric, or a combination of the foregoing materials. For the purposes of this specification, a low-k dielectric material is any material having a dielectric constant of less than approximately 3.5.

In accordance with one embodiment, the thickness of the trench-fill material 30 is in a range of approximately 500–1000 nanometers. Typically, the trench-fill material 30 completely fills the opening 24 as shown in FIG. 3. Therefore, the thickness usually varies as a function of the depth of the opening 24. The initially formed thickness of the trench-fill material 30 generally corresponds to a thickness of portions of the trench-fill material 30 overlying the polish stop layer 22. This thickness is indicated by the dimension 32 as shown in FIG. 3. Recesses in surface of the trench-fill material 30 are indicated by the dimension 34 shown in FIG. 3. The recesses correspond with regions of the substrate in which trench opening are formed. The amount, or depth, of the recess generally approximates the depth of the trench. The difference between dimension 32 and dimension 34 translates to a nonuniformity of the trench-fill material 30 overlying the substrate 20. The inventors have recognized that reducing this difference can both remove a substantial amount of the fill material 30, as well as, reduce the non-uniformity of the surface. This can be advantageous in reducing the overall time required to perform the polishing operation and in improving the post-polish uniformity of the substrate surface. The inventors have further recognized that this reduction can be accomplished using methods that are novel over the prior art, as will be subsequently discussed.

Figure 4:
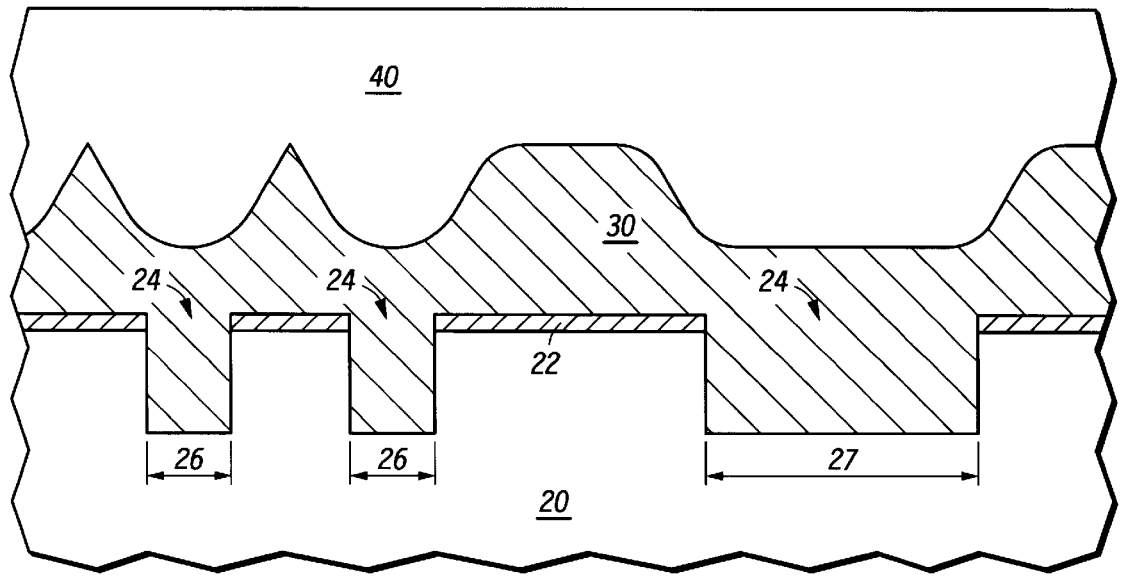

In accordance with embodiments of the present invention, a blanket layer 40 is formed over the trench-fill material 30, as shown in FIG. 4. Typically, the blanket layer 40 is formed as a substantially planar layer that completely covers the fill material 30. In one embodiment, the blanket layer 40 is an I-line resist that has been spun-on using conventional methods. The thickness of the blanket layer 40 is in a range of approximately 500–1200 nanometers. In other embodiments, other materials, such as G-line resists, deep ultraviolet (DUV) resists, planarization resists, SOG, and the like, can be used. In yet other embodiments, any material that can be formed as a substantially planar layer and removed selectively to the trench-fill material can be used for the blanket layer 40.

Figure 5:
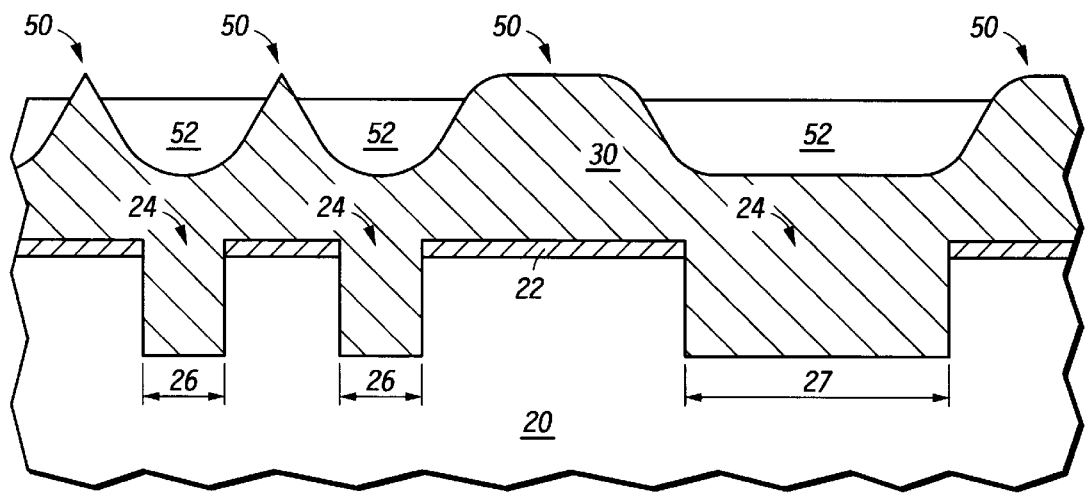

The substrate is then processed to remove upper portions of the blanket layer 40, as shown in FIG. 5. In one embodiment, the blanket layer 40 is etched using a resist etch back (REB) process having an etch selectivity of the blanket layer 40 to the trench-fill material 30 that is approximately 30 to 1. For the purposes of this specification, etch selectivity is the ratio of the etch rate of one material relative to the etch rate of another material. For example in this embodiment, the etch rate of the blanket layer 40, during this processing step, is approximately 30 times greater than the etch rate of the fill material 30.

The REB process continues until portions of the fill material 30 are exposed, as indicated by the exposed regions 50, shown in FIG. 5. In accordance with one embodiment of the present invention, the REB process is performed using a downstream asher, such as a GaSonics 3510 downstream plasma asher, made by GaSonics International of San Jose, Calif. The process uses diatomic oxygen ($O_2$) and nitrogen ($N_2$) as process gases. The ratio of $O_2$ to $N_2$ is in a range of approximately 10–15 to 1. The REB process power is in a range of approximately 800–1200 watts (W), pressure is in a range of approximately 0.2–2.5 Torr, and lamp temperature is in a range of approximately 170–250 degrees Celsius.

The REB process is typically terminated using end-point detection in combination with an overash (overetch) processing step, however, a fixed time REB process or any combination of fixed time, endpoint, and overash can alternatively be used. In one embodiment, the process is endpointed after removing portions of the blanket layer 40 (resist) and exposing portions of the underlying trench-fill material 30 (oxide). Endpointing can occur by detecting a predetermined change in the amount of carbon monoxide (CO) emissions, which are a by-product of the ashing process. The endpoint time or the overash time can be adjusted to expose varying degrees of the underlying trench-fill material. Therefore, if removal of a larger surface area of trench-fill material is desired, then the endpoint time can be specified to occur later in the process after a drop in the CO emission that corresponds to the exposure of more fill material has occurred or, alternatively, the overash time can be extended to expose more fill material. Alternatively, if less exposed area of the trench-fill material 30 is desired, then the endpoint time can be adjusted such that the endpoint occurs earlier in the process or the overash time can be reduced.

In an alternative embodiment, if a more planar surface is desired, wherein the exposed regions 50 do not protrude as much above the surface of the substrate as in the previous embodiments, then the selectivity of the REB process can be adjusted, such that the selectivity of the blanket layer 40 to the trench-fill material 30 is closer to one-to-one when the trench-fill material is exposed. This can be accomplished by incorporating fluorine-containing gasses into to the process. Those of ordinary skill in the art recognize that the selectivity of the blanket layer 40 to the trench-fill material 30 can be optimized without undue experimentation.

In yet another embodiment, a multi-step REB process can be used to remove portions of the blanket layer 40. In this embodiment, a bulk removal processing step removes portions of the blanket layer 40 prior to exposing portions of the fill material 30. The removal rate of the blanket layer 40 during the bulk removal step is greater than the removal rate of the blanket layer 40 after exposing the fill material 30. This embodiment provides the additional advantage of having higher throughput.

After exposing regions 50 of the trench-fill material 30, using the REB process, portions of the exposed regions 50 of the trench-fill material are then removed using an etch process that is selective to the blanket layer 40. In addition, it can be advantageous in this embodiment to use an etch process that is also selective to the underlying polish stop material 22 in the event the polish stop material 22 is exposed during the etch process. In embodiments where the trench-fill material 30 is a silicon oxide formed using a HDP-CVD process and the blanket layer 40 is resist, the trench-fill material 30 can be removed using a conventional anisotropic or isotropic oxide etch process that has an oxide to resist selectivity that is greater than approximately 10 to 1. Often the selectivity is greater than approximately 15 to 1, and more often the selectivity is greater than approximately 20 to 1. Similarly, in embodiments where the polish stop layer 22 is a nitride layer, the oxide to nitride etch selectivity is typically greater than approximately 10 to 1.

In accordance with one embodiment, the oxide etch process is performed using a conventional anisotropic reactive ion etch (RIE) process that uses octofluorobutane ($C_4F_8$), argon (Ar), and carbon monoxide (CO) as etchant gasses. The ratio of Ar to $C_4F_8$ is in a range of approximately 25–30 to 1, and the ratio of CO to $C_4F_8$ is in a range of approximately 20–25 to 1. The oxide etch process pressure is in a range of approximately 50–60 millitorr (mt), and the power is in a range of approximately 1500–2000 W.

Figure 6:
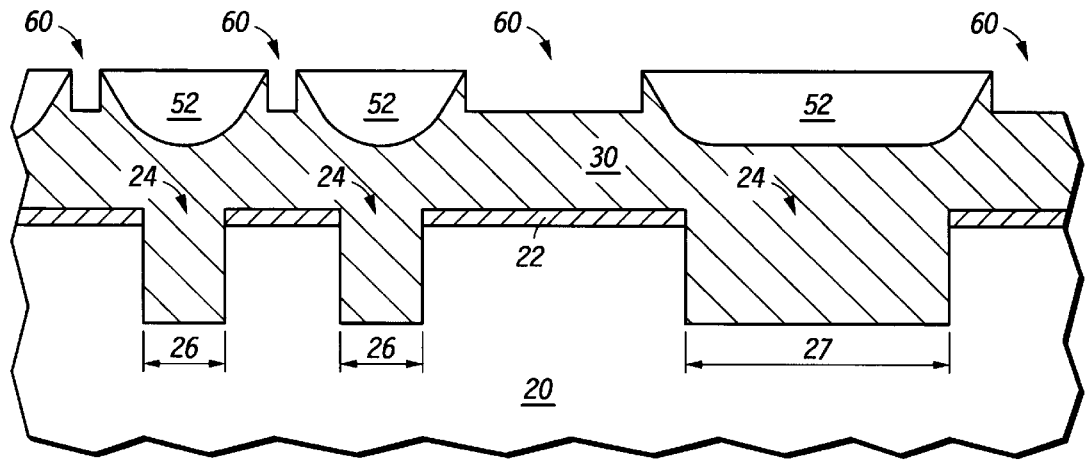

The etch forms cavities 60 in the trench-fill material 30 as shown in FIG. 6. The pattern of the cavities 60 is defined by remaining portions of the blanket layer 40. In one embodiment, the etch process is performed as a timed etch to remove approximately 150 nanometers of the trench-fill material 30. Alternatively, the etch process can target to remove an amount of trench-fill material 30 that is a percentage of the thickness of the fill material. For example, in an embodiment where the trench-fill material 30 is initially formed to a thickness of approximately 600 nm, a removal of 150 nm would correspond to a removal of approximately 25% of the film's initial thickness. Therefore, as device dimensions are scaled, the amount of trench-fill material 30 that is removed can correspondingly be scaled to accommodate the changes to the device dimensions. In addition, the etch process time can be optimized for small and large features. That is, smaller features may require the removal of less material and use a shorter etch time as compared to larger features that may require the removal of a greater amount of material.

The overall depth of the cavity 60 can also be adjusted to optimize the removal of remaining trench-fill material during subsequent CMP processing. For example, to further reduce the non-uniformity of the trench-fill material 30, the etch process can target to remove an amount of trench-fill material 30 that corresponds to the dimension 34 in FIG. 2. In this manner, the depth of the cavity 60 would have a bottom that is substantially on the same horizontal plane as that of the upper surface of the trench-fill material above a wide trench opening. For the purposes of this specification, a wide trench opening is any trench opening that has a width that is at least two times greater than its depth. Those of ordinary skill in the art appreciate that the etch time and depth can vary according to these considerations.

Figure 7:
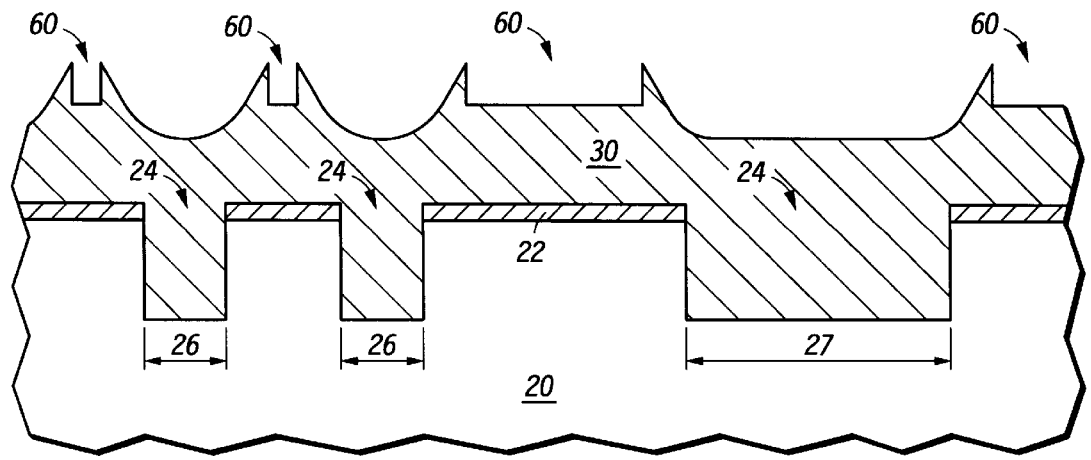

After forming the cavity 60 in the fill material 30, the remaining portions of the blanket layer 40 are removed, as shown in FIG. 7. The removal of the blanket layer 40 is typically done using conventional processing. For example, if the blanket layer 40 is a resist layer, it can be removed using an O2 ashing process, a wet chemical process, such as sulfuric peroxide, or a combination of the two processes.

In alternative embodiments, any combination of processing steps described in FIGS. 5, 6, and 7 can all be integrated into a single processing system. In one embodiment, the REB, oxide etch, and blanket layer removal are all be performed during a single processing sequence on a single processing platform prior to removing the substrate from the processing platform. In another embodiment, the REB and the oxide etch are performed during a single processing sequence on a single processing platform prior to removing the substrate from the processing platform. In yet another embodiment, the oxide etch and blanket layer removal are performed during a single processing sequence on a single processing platform prior to removing the substrate from the processing platform. The integration of these processing steps onto a single processing platform significantly reduces cycle time and the likelihood of misprocessing.

Figure 8:
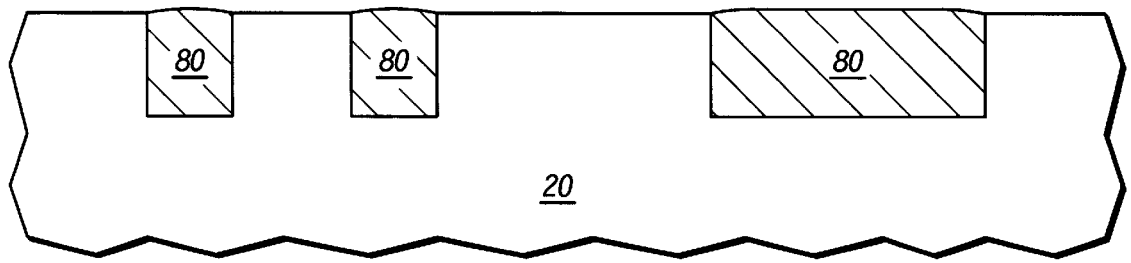

After removing the blanket layer 40, the substrate is polished using a conventional dielectric CMP process to remove the remaining portions of the trench-fill material 30 lying outside of the trench opening. Processing alternatively continues to remove the remaining portions of the polish stop layer 22 to form trench isolation structures 80 as shown in FIG. 8.

Figure 9:
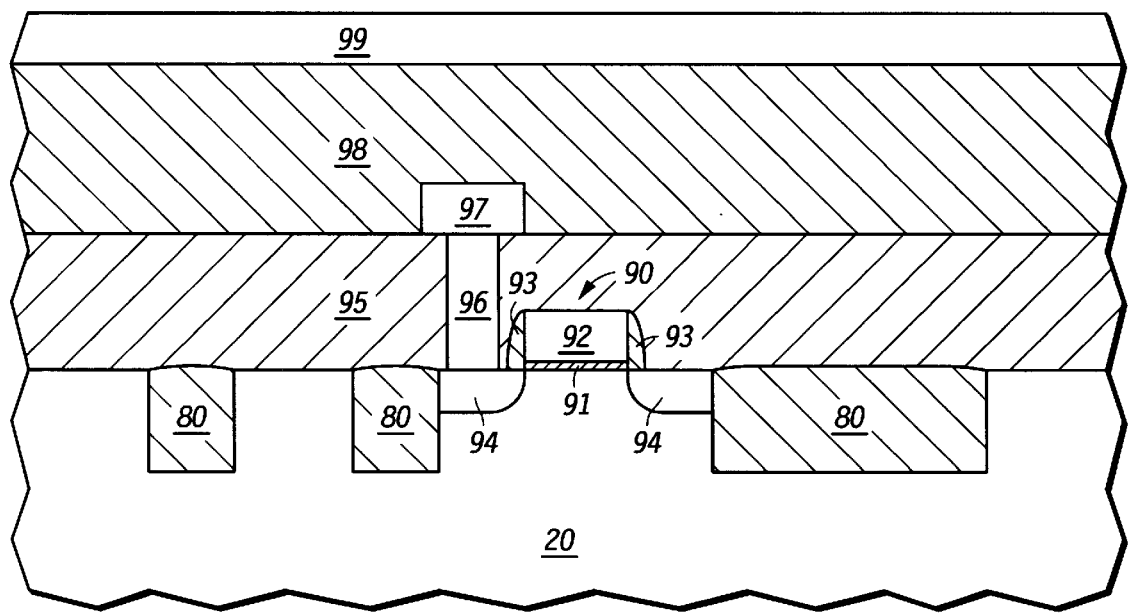

Processing continues to form a substantially completed device as shown in FIG. 9. After forming the trench isolation structures 80, a transistor 90 is formed. The transistor 90 comprises a gate dielectric 91, a gate electrode 92, spacers 93, and source and drain regions 94. The processes and materials used to form the transistor are conventional. A dielectric layer 95 is then formed over the transistor 90 and the semiconductor device substrate 20. In one embodiment, the dielectric layer 95 is a plasma deposited oxide formed using TEOS as a source gas. Alternatively, dielectric layer 95 can be a layer of BPSG, a layer of PSG, a silicon oxynitride, a fluorinated oxide, an SOG, a low-k dielectric, or a combination thereof. The dielectric layer 95 is subsequently patterned, etched, filled with a conductive material, such as tungsten or polysilicon and then polished to form a conductive plug 96. Conductive interconnect 97 overlies the conductive plug 96. The conductive interconnect 97 is typically formed by depositing a conductive material, such as an aluminum-containing or a copper-containing film, over the dielectric layer 95, and then patterning and etching the conductive material to form the conductive interconnect 97. In alternative embodiments, the combination of the interconnect 97 and the conductive plug 96 can be formed using inlaid interconnect processing methodologies, whereby the conductive plug and the conductive interconnect are formed simultaneously using a combination of barrier and copper-containing fill materials.

After forming the conductive interconnect 97, a second dielectric layer 98 is formed over the semiconductor device substrate 20. The second dielectric layer 98 can be formed using any of the materials and processes previously described to form the dielectric layer 95. A passivation layer 99 is then formed over the dielectric layer 98. For the purposes of this specification, a passivation layer is an insulating layer formed over the uppermost level of interconnects. Typically, the passivation layer 99 is a layer of silicon oxynitride that is formed using conventional plasma deposition techniques. Alternatively, passivation layer 99 may be a layer of plasma deposited silicon nitride, a boron nitride layer, or the like. Additional interconnects and circuitry may be formed in the embodiments described, herein, in order to form more complicated semiconductor devices.

Embodiments of the present invention have several advantages over the prior art. For example, prior art processes, which do not use a pre-polish etch processing step typically require longer polishing times. The longer polishing times not only negatively impact cycle time but also the lifetime of CMP consumables, such as the polishing pad and slurry. Both of which result in increased manufacturing costs. Other prior art processes that incorporate an etch process, require that the substrate be lithographically patterned prior to etching and polishing the substrate. The patterning operation is time consuming and expensive.

The previous embodiments described herein refer to trench isolation structures. However, these embodiments are applicable to virtually any type of planarization processing that relies on chemical mechanical polishing to form the structure. For example, in the event a polishing process is utilized to planarize an insulating layer overlying conductive members, such as interconnects, the processing methodology described herein can be extended such that the blanket layer is formed over the insulating layer and then selectively etched back using a process similar to that used to etch back the blanket layer 40 in FIGS. 4–5. The etch back continues until exposing portions of the insulating layer overlying the interconnect, which would be similar those portions of the fill material overlying the polish stop 22 shown in FIG. 5. The insulating layer is etched to form a cavity using a dielectric etch process similar to that used to form the cavity 60 in the trench-fill material 30 in FIG. 6. The blanket layer is then removed, and the insulating layer polished to form a substantially planar insulating layer surface over the interconnect.

In addition, the embodiments described herein can be extended for use in forming other features in trenches, such as capacitors in deep trench capacitors or interconnects in single or dual inlaid openings. For example, in an alternative embodiment, the substrate includes a dielectric layer in which a trench opening is formed. In this embodiment, the fill material could include a conductive-fill material and the blanket layer could include a resist, or alternatively the blanket layer could include any material that can be selectively etched with respect to the conductive-fill material. The subsequent removal of the blanket layer to expose the fill material, removing the fill material to form a cavity, removing remaining portions of the blanket layer, and polishing to form a trench-filled structure could all then be performed using the appropriate materials and process.

In addition to the benefits observed with respect to cycle time, additional benefits include a reduction in the amount of defects that occur as a result of the polishing process when using embodiments of the present invention. For example, in the prior art, high topography regions, that are polished, easily break away from underlying regions during the polishing process. Depending on their size when separated, they can contribute to elevated defect densities. By reducing the height of these high topography regions prior to performing the polishing step, the tendency of them to separate and generate particles is reduced. A further benefit is that the processes described herein can be integrated relatively easily into an existing process flow without having to develop significantly different processes or use exotic or unusual materials.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:

forming a patterned feature layer over a trench field isolation region lying within a substrate, wherein the patterned feature layer defines an opening;

forming a first layer over the substrate and within the opening;

forming a second layer over the first layer;

removing portions of the second layer to expose a portion of the first layer;

removing portions of the first layer;

removing a remaining portion of the second layer; and polishing the first layer to form a semiconductor device member.

2. The method of claim 1, wherein removing portions of the first layer further comprises etching portions of the first layer to form a cavity in the first layer prior to removing the remaining portions of the second layer.

3. The method of claim 2, wherein the first layer includes a dielectric layer and the semiconductor device member comprises a trench isolation structure.

4. The method of claim 1, further comprising forming a third layer before forming the opening, wherein the opening extends at least partially through the third layer.

5. The method of claim 4, wherein:

the third layer is a dielectric layer;

the first layer is a conductive layer; and semiconductor device member comprises a member selected from a group consisting of an interconnect and an capacitor electrode.

6. The method of claim 4, wherein:

the third layer is a conductive layer;

the opening corresponds to removed portions of the conductive layer that define conductive traces over the substrate; and the first layer is a dielectric layer.

7. A method for forming a semiconductor device comprising:

forming an opening in a substrate;

forming a first layer over the substrate and within the opening;

forming a blanket layer over the first layer;

removing portions of the blanket layer and exposing a portion of the first layer, wherein a pattern exposing the portion of the first layer is defined by a remaining portion of the blanket layer;

removing an amount of the portion of the first layer to form a cavity in the first layer;

removing the remaining portion of the blanket layer after removing the amount of the portion of the first layer to form the cavity; and removing remaining portions of the first layer lying outside the opening.

8. The method of claim 7, wherein removing remaining portions of the first layer lying outside the opening defines a trench isolation structure.

9. The method of claim 7, wherein the first layer includes a dielectric material.

10. The method of claim 9, wherein the dielectric material includes an oxide.

11. The method of claim 7, wherein the first layer includes a conductive material.

12. The method of claim 11, wherein the conductive material comprises a material selected from the group consisting of copper, aluminum, titanium, tantalum, and tungsten.

13. The method of claim 12, wherein the blanket layer is selected from a group consisting of resist, polyimide, and spin-on-glass.

14. The method of claim 7, wherein a selectivity between the blanket layer and the first layer during removing portions of the blanket layer to expose a portion of the first layer is greater than 10 to 1.

15. The method of claim 14, wherein a removal rate of the blanket layer prior to exposing portions of the first layer is greater than a removal rate of the blanket layer after exposing portions of the first layer.

16. The method of claim 7, wherein a selectivity between the first layer and the blanket layer during the removing an amount of the portion of the first layer to form a cavity is greater than approximately 10 to 1.

17. The method of claim 7, wherein the first layer is formed having a thickness in a range of 500–1000 nm.

18. The method of claim 7, wherein removing an amount of the portion of the first layer to form a cavity and removing the remaining portion of the blanket layer are performed using a single processing platform during a single processing sequence and without removing the substrate from the single processing platform.

19. The method of claim 18, further comprising removing portions of the blanket layer and exposing a portion of the first layer using the single processing platform during the single processing sequence without removing the substrate from the single processing platform.

20. The method of claim 7, further comprising:

forming an interconnect over the substrate; and forming a passivation layer over the interconnect.

* * * * *